(12) United States Patent
Nishiyama

(10) Patent No.: US 7,755,189 B2
(45) Date of Patent: Jul. 13, 2010

(54) METAL CAP WITH RINGED PROJECTION TO BE WELDED TO STEM AND RINGED GROOVE PROVIDED IMMEDIATELY INSIDE OF RINGED PROJECTION AND OPTICAL DEVICE HAVING THE SAME

(75) Inventor: Naoki Nishiyama, Yokohama (JP)

(73) Assignee: Sumitomo Electric Industries, Ltd, Osaka-shi (JP)

( * ) Notice: Subject to any disclaimer, the term of this patent is extended or adjusted under 35 U.S.C. 154(b) by 0 days.

(21) Appl. No.: 12/508,119

(22) Filed: Jul. 23, 2009

(65) Prior Publication Data

US 2010/0025846 A1 Feb. 4, 2010

(30) Foreign Application Priority Data

Jul. 29, 2008 (JP) .............................. 2008-194827

(51) Int. Cl.
*H01L 31/0203* (2006.01)
(52) U.S. Cl. .............................. 257/733; 257/E25.032; 361/760
(58) Field of Classification Search ........... 257/98–100, 257/431–433, 729, E25.031, E31.117; 361/760–761
See application file for complete search history.

(56) References Cited

U.S. PATENT DOCUMENTS

| 5,610,395 | A | * | 3/1997 | Nishiyama | ................. 250/239 |
|---|---|---|---|---|---|
| 6,034,424 | A | * | 3/2000 | Fujimura et al. | ............. 257/696 |
| 7,019,374 | B2 | * | 3/2006 | Kayanuma et al. | ........... 257/432 |
| 7,088,397 | B1 | * | 8/2006 | Hunter et al. | ................ 348/374 |
| 7,138,667 | B2 | * | 11/2006 | Barnett et al. | .................. 257/99 |
| 7,164,193 | B2 | * | 1/2007 | Takahashi et al. | ............ 257/678 |
| 7,215,886 | B2 | * | 5/2007 | Maruyama et al. | ........... 398/117 |
| 7,358,106 | B2 | * | 4/2008 | Potter | ........................... 438/51 |
| 7,423,334 | B2 | * | 9/2008 | Tu et al. | ....................... 257/680 |
| 7,504,670 | B2 | * | 3/2009 | Shiraishi et al. | ................ 257/99 |
| 7,540,669 | B2 | * | 6/2009 | Sato | ............................ 385/92 |
| 7,576,427 | B2 | * | 8/2009 | Potter | .......................... 257/710 |
| 2004/0233650 | A1 | * | 11/2004 | Miyashita et al. | ............ 361/760 |

FOREIGN PATENT DOCUMENTS

JP 2007-134644 5/2007

* cited by examiner

*Primary Examiner*—Nathan W Ha
(74) *Attorney, Agent, or Firm*—Venable LLP; Michael A. Sartori, Ph.D.

(57) ABSTRACT

An optical device with a CAN package is disclosed, where the cap is resistance-welded to the stem without causing failures due to fragments by the welding flying within the package. The cap of the invention has a flange portion to be welded to the stem. The flange portion provides a ringed groove in addition to the ringed projection for the welding. The fragment due to the welding may be captured in the ringed groove and is prevented from flying within the package. The ringed groove and the ringed projection are simultaneously formed in the stamping to form the body portion of the cap.

14 Claims, 7 Drawing Sheets

METAL CAP WITH RINGED PROJECTION TO BE WELDED TO STEM AND RINGED GROOVE PROVIDED IMMEDIATELY INSIDE OF RINGED PROJECTION AND OPTICAL DEVICE HAVING THE SAME

BACKGROUND OF THE INVENTION

1. Field of the Invention

The present invention relates to an optical device that provides a metal cap welded to stem to seal a space air-tightly where a semiconductor optical device, such as semiconductor laser diode (LD) or semiconductor photodiode (PD), is mounted therein.

2. Related Prior Art

An optical device that provides a co-axial package, generally comprises of a metal stem and a metal cap. The stem mounts the LD or the PD and occasionally some electronic components such as pre-amplifier IC for amplifying a signal generated by the PD and driver IC for driving the LD. The cap, fixed to the stem air-tightly, provides a space in which the LD or the PD and the electronic components are enclosed. In the co-axial package of the optical device, the stem has a disk shape, while, the cap has a cylindrical shape. The cap comprises a shell portion and a flange portion. The shell portion provides a transparent window through which the light emitted from the LD or heading the PD installed within the space passes; while the flange portion located in a side opposite to the transparent window is fixed to the stem by the welding.

Assembling the cap with the stem, the cap in the flange portion thereof is fixed to the stem by, for instance, the resistance welding. As illustrated in FIG. 4, the resistance welding puts the flange 102a of the cap 102 aligned with the stem 103 between two electrodes, E1 and E2, such that a peripheral portion of the flange 102a and the stem 103 are pressed by the electrodes E1 and E2 and provided with a huge pulse current to melt the peripheral portion of the flange 102a and the stem 103. Thus, the cap 102 is welded to the stem 103. However, the resistance welding described hereto often causes or brings a failure such as short-circuit between components or mechanical damages induced in the components installed within the package by fragments melted at the welding and flown within a inner space. Even the welding does not bring the fragment flown in the space S, the surplus metal melted by the welding seeps out within the inner space S and occasionally causes the flown fragment when the cap 102 and the stem 103 receives vibrations.

The flange portion 111a of the shell 111 sometimes provides a ringed projection 111b with a height about 0.1 mm to increase the current density at the welding. This ringed projection 111b may facilitate the melting of the flange portion 111a and makes the welding in homogeneous around the stem 112. However, the ringed projection 111b brings no effect for the detachment of excess portions of the projection into the space S. The top end portion of the ringed projection 111b easily melts by the pulsed current, rather, the melting is facilitated by the projection, the melted projection easily expands within the space S by the pressure to abut the flange portion 111a against the stem 112.

The melted projection and extended within the space S causes the failures mentioned above. An adequate condition of the resistance welding, in particular, reduced pressure to abut the flange portion 111a against the stem 112, may decrease the possibility for excess fragments by the welding to ooze within the space S. However, the reduced pressure at the welding inevitably brings a less reliability in the air-tightness.

A Japanese Patent Application published as JP-2007-134644A has disclosed an optical device with a cap welded to the stem, which is schematically illustrated in FIG. 7. The flange portion of the cap in the prior art above provides a ringed projection 122a accompanied with a step 122b extending along and immediate inside of the ringed projection 122a. The step 122b, which is provided to secure the height of the welded projection 122a and has a function to protect the projection 122a against the excess crushing, may also show another function to prevent the melted fragments by the welding from flying into the space S.

SUMMARY OF THE INVENTION

It may be quite effective to prevent the melted fragments flown within the space for the arrangement of the projection 122a and the step 122b shown in FIG. 7. However, the step 122b accompanied with the projection 122a can not be easily prepared. The machining for the metal block may prepare the stem 122b but is a cost ineffective technique. The present invention, in consideration of the prior art shown in FIG. 7, is to provide, by a cost effective technique, an arrangement of the cap welded to the stem, which fundamentally prevents the melted fragments of the projection from flying within the inner space S.

SUMMARY OF THE INVENTION

One aspect of the present invention relates to an optical device that provides a semiconductor optical device such as LD and PD. The optical device of the present invention comprises a metal stem with a disk shape and configured to mount the semiconductor optical device thereon, and a metal cap with a body portion and a flange portion. The body portion has a substantially cylindrical shape, while, the flange portion is formed in an end of the body portion. The flange portion provides a ringed projection that is welded to the metal stem and a ringed groove that is formed immediately inside of the ringed projection. The ringed groove has a hollow extending to a direction opposite to the ringed projection. The present invention has a feature that the body portion and the flange portion of the cap are formed by stamping of a metal sheet including the ringed projection and the ringed groove, and the ringed groove captures the fragments caused by the welding of the ringed projection to the stem.

The hollow of the ringed groove has a cross section of a trapezoid whose volume is substantially equal to or greater than a volume of the ringed projection before the welding. The cap may be made of alloy of iron (Fe), nickel (Ni) and cobalt (Co), or clod-rolled steel. The ringed groove may be an concentric circle with the ringed projection to capture the fragments due to the welding in homogeneous along the peripheral of the disk shaped stem.

BRIEF DESCRIPTION OF DRAWINGS

The invention will be described in further detail with reference to the attached drawings in which.

DETAILED DESCRIPTION OF PREFERRED EMBODIMENTS

Figure 1:
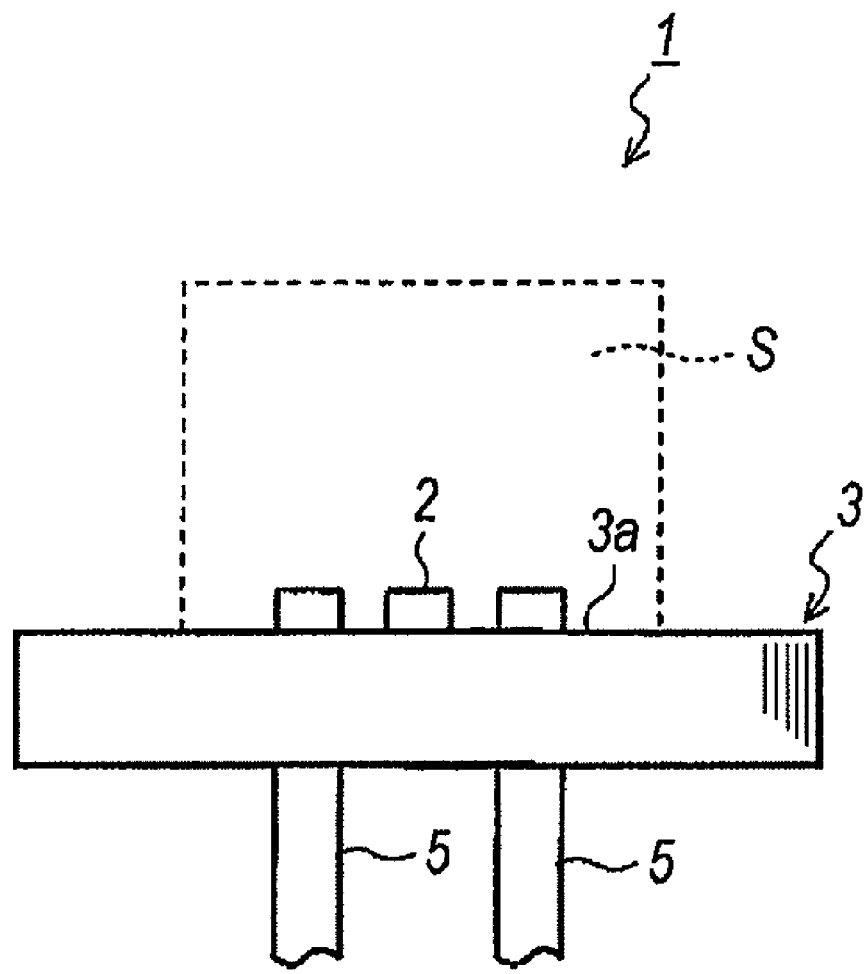
FIG. 1 is a cross section of the optical device according to an embodiment of the invention, where the cap is omitted to describe the stem of the optical device.
Figure 2A:
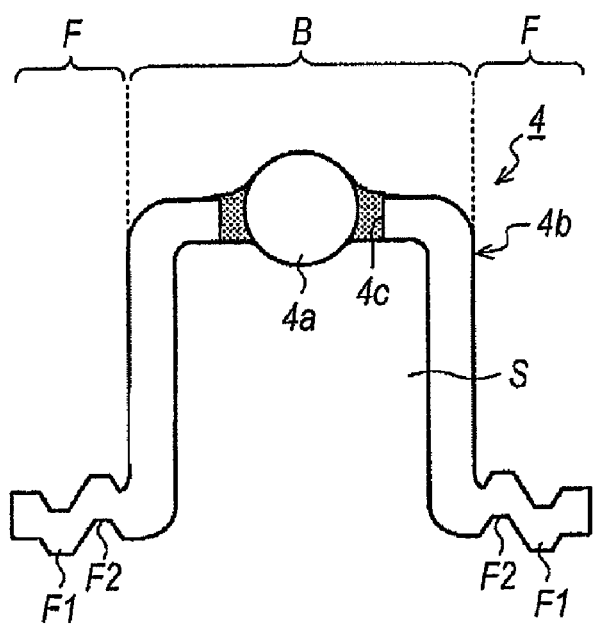
FIGS. 2A to 2C are a cross section, a plan view and a magnified view of the flange portion of the cap, respectively, according to an embodiment of the present invention.
Figure 2B:
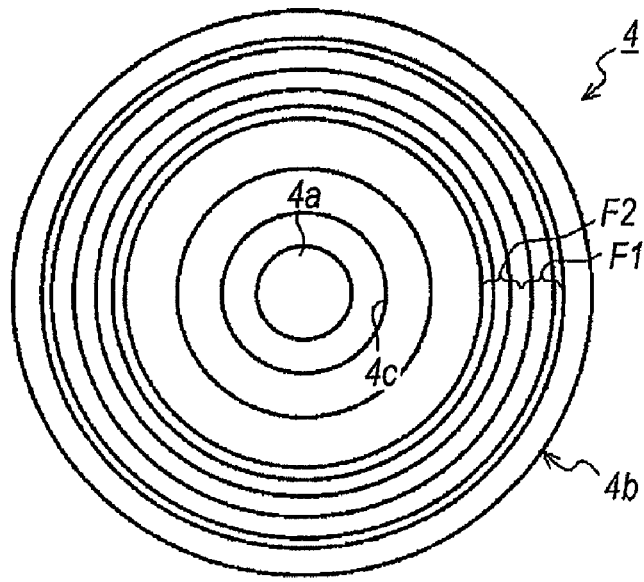
Figure 2C:
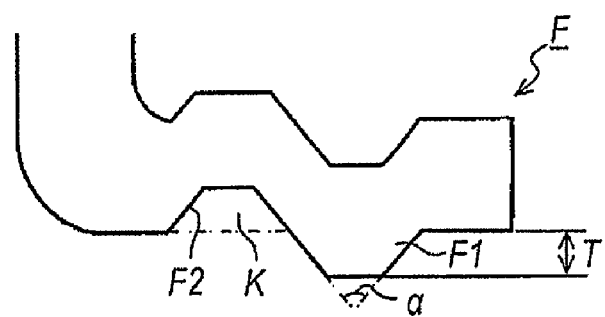

FIG. 1 schematically illustrates a cross section of an optical device according to an embodiment of the present, while, FIGS. 2A to 2C schematically illustrate the cap of the optical device. FIGS. 2A to 2C are a cross section, a plan view, and a magnified view of the cap 4, respectively. The optical device according to the present embodiment is a type of a receiver optical sub-assembly (hereafter denoted as ROSA) that installs a semiconductor photodiode (hereafter denoted as PD) as an optical-to-electrical converting device. Although the description concentrates on the ROSA, spirits of the present invention may be similarly applicable to another type of the optical device, which is called as transmitter optical sub-assembly (hereafter denoted as TOSA) that installs a semiconductor laser diode (hereafter denoted as LD) as an electrical-to-optical converting device.

The optical device 1 of the present embodiment provides a stem 3 and a cap 4 fixed to the stem 3. On the stem 3 is mounted with the PD 2 in a space S formed by the stem 3 and the cap 4, and air-tightly sealed from the outside. The optical device 1 shown in the figures has a substantially cylindrical shape and often called as a CAN-type device. The cap 4 is fixed to the top surface of the stem 3 by the projection welding.

The stem 3, which is made of metal, has a primary surface 3a on which the semiconductor device such as PD 2 in this embodiment is mounted. The stem 3 may be formed by the extruding of a metal plate made of, for instance an alloy of iron (Fe), nickel (Ni) and cobalt (Co), which is often called as Kovar, or a cold-rolled steel plate, plated with nickel (Ni) and gold (Au). The stem 3 has a substantially disked shape with a diameter around 5.6 mm. The primary surface 3a of the stem 3 may also mount another electrical devices such as pre-amplifier to amplifier a faint electrical signal generated by the PD 2 and some capacitors inserted in power lines.

The stem 3 also provides a plurality of lead pins 5 through a seal glass. The lead pins 5 are electrically conducted to the PD 2 or the pre-amplifier with bonding wires to bring the signal generated by the PD and/or amplified by the pre-amplifier out of the optical device.

The cap 4 that covers the primary surface 3a of the stem provides a lens 4a and a shell 4b that holds the lens 4a. The cap 4 may be formed by, first punching the meal plate made of alloy of iron and nickel with a thickness of about 0.2 mm to obtain a metal disk with an aperture into which the lens 4a is set; and second stamping the metal disk to form the shell 4b. The present invention has a feature that this stamping also forms the projection and groove, which will be described in detail later, in the shell 4b. Finally, fixing the lens 4a to the shell 4b by a seal glass, the cap 4 is completed. The shell 4b is preferably coated with nickel and gold.

Referring to FIG. 2A, the shell 4b provides a body portion B to form the space S accompanied with the stem 3 and a flange portion F around the body portion B. The body portion B holds the lens 4a in the aperture 4c formed in a center portion through the seal glass. The lens 4a may be a ball-lens with a diameter around 1.5 mm, which is provided from HOYA as the product TAF3. On the surface of the lens 4a is coated with an anti-reflection film that shows the reflectivity of substantially zero to the light with a wavelength of 1.3 µm and 1.55 µm.

The flange portion F, as illustrated in FIGS. 2A to 2C, provides a ringed projection F1 so as to extrude a direction opposite to a side where the space S is formed. The flange portion F also provides, in inner side of the ringed projection F1, a ringed groove F2 so as to form a hollow to a direction of the space S. The ringed projection F1 and the ringed groove F2 form concentric circles on the flange portion F.

The ringed projection F1, as illustrated in FIG. 2C, has a cross section of the isosceles triangle with an apex angle α about 75° and truncated in an apex portion, that is, the cross section of the ringed projection may be a trapezoid. The height T of the ringed projection F1 is set to be 0.1 mm. On the other hand, the ringed groove F2 has a cross section with an inner space K whose shape traces the cross section of the ringed projection F1. The volume of the space K is preferably equal to or slightly greater than the volume of the ringed projection F1. In the present embodiment, the ringed groove F2 continues from the ringed projection F1. The ringed projection F1 and the ringed groove F2 may be simultaneously formed by the stamping to shape the body portion B.

Because the ringed groove F2, as described above, is formed inside of the ringed projection F1, flown fragments derived from the melted projection F1 may be captured within the ringed groove F2. The resistance welding to fix the cap 4 to the stem 3 often causes the fragments of the melted projection flown inside and outside. The fragments flown inside of the cap 4 often causes failures to make the electronic circuit short out and to affect damages to the devices. The ringed groove F2 formed immediately inside of the ringed projection F1 may efficiently capture the fragment due to the welding of the ringed projection F1 and flown inside of the cap 4; accordingly, the short-circuit due to the flown fragment may be prevented even the optical device 1 is vibrated.

Figure 3:
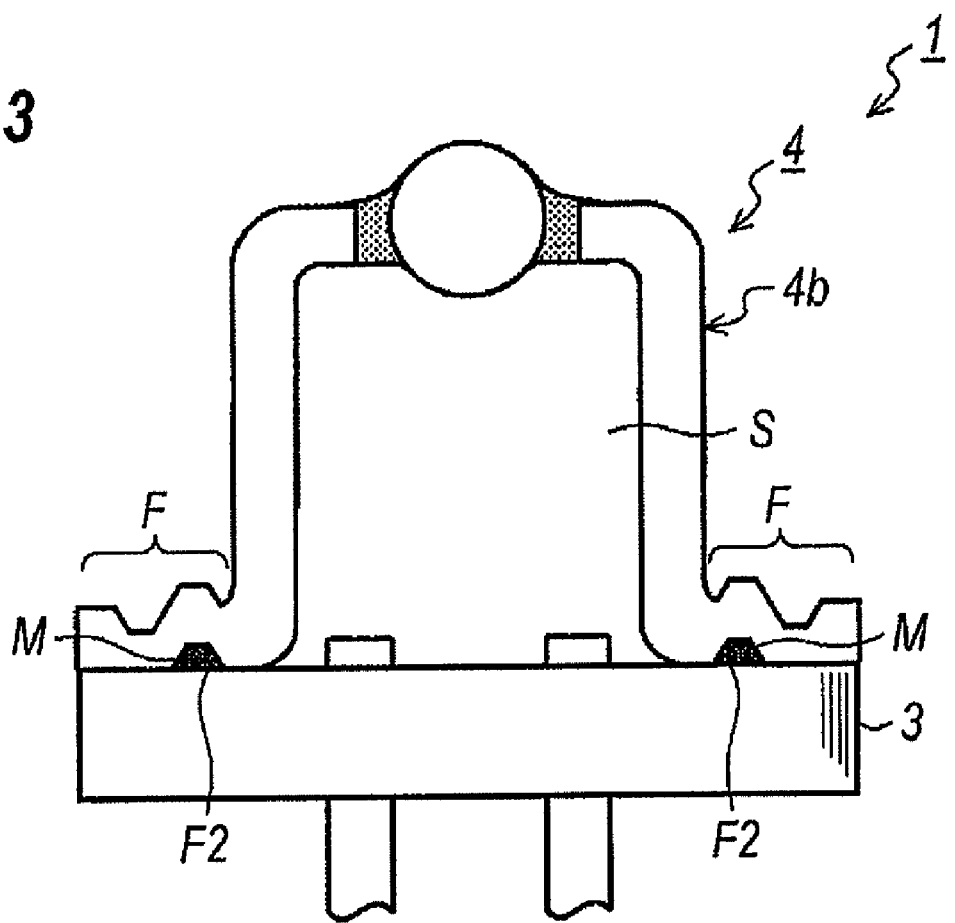
FIG. 3 is a cross section where the cap is resistance-welded to the stem.

Because the volume K of the ringed grove F2, as already described, is substantially equal to, or slightly less than the volume of the ringed projection F1, the melted projection M may fill the ringed groove F2, as illustrate in FIG. 3, and be solidified there, which may contribute the fixing of the cap 4 to the stem 3, specifically, the air-tightness of the space S may be enhanced. Moreover, because the cross section of the ringed groove F2 has a normal trapezoid with a lower side longer to an upper side, the capturing of the flown fragments and the air-tightness of the space S may be also enhanced.

Figure 4:
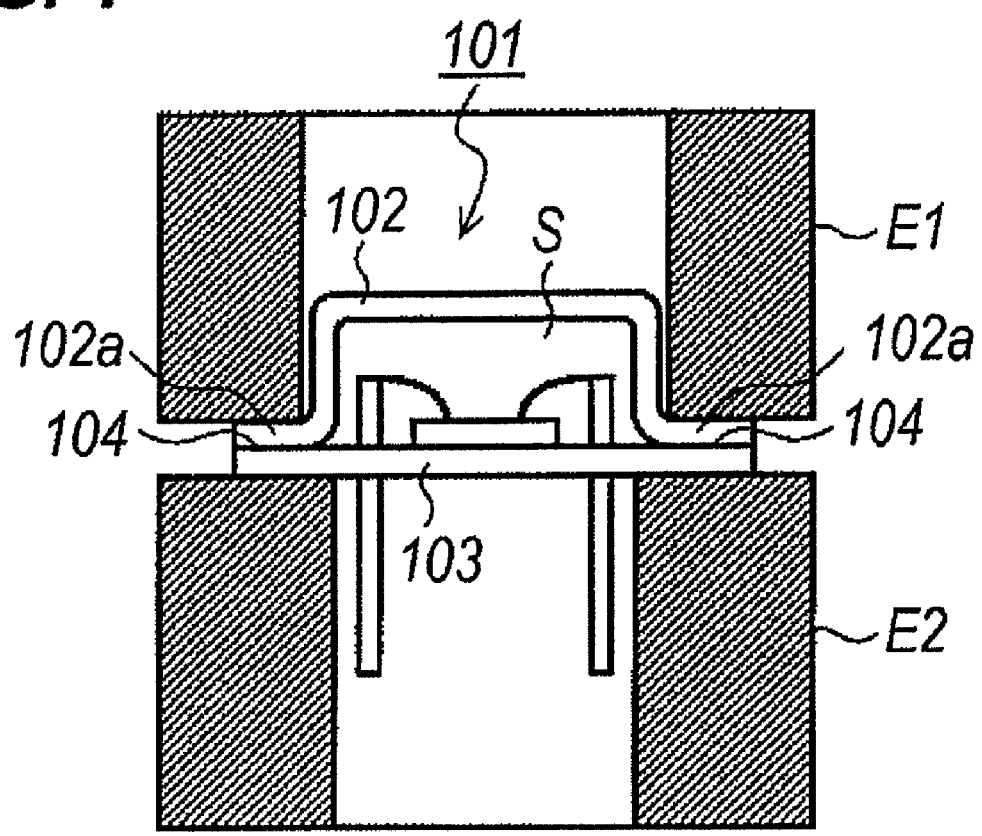
FIG. 4 schematically illustrates a process to resistance-weld the cap to the stem.

Next, results of the present invention will be described. Two samples were prepared and compared, one of which has the cap whose shape is shown in FIGS. 2A to 2C, while, the other has a cap whose shape is shown in FIG. 4. The PIND test (Particle Impact Noise Detector test) based on the standards, MIL-STD-883-2020 and MIS-STD-750-2052, was carried out for these two optical devices. The PIND test investigates the existence of alien substances within a hollow body. Impacting the optical device to facilitate the movement of the alien substance within the hollow body and vibrating the optical device on the vibrating table, the noise level whose frequencies out of the vibrating frequency was investigated to determine the existence of the alien substances within the hollow body.

The conventional device shown in FIG. 4 caused 3 failures among 100 samples under the PIND test; while, the device with the cap shown in FIGS. 2A to 2C showed only one failure among 100 samples. Thus, the cap 4 with the ringed groove F2 immediate inside of the ringed projection F1 may effectively prevent the melted fragments from flying into the space inside of the cap 4.

Figure 5:
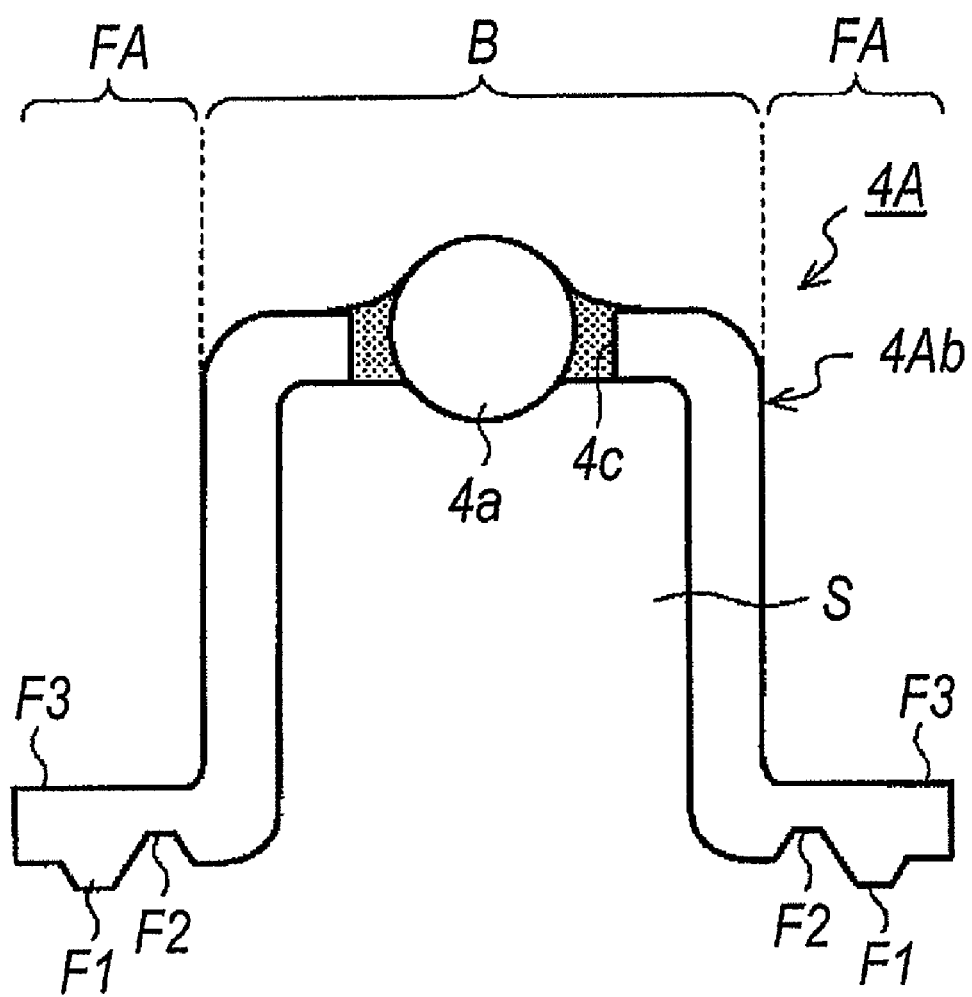
FIG. 5 is a cross section of another cap that provides a modified structure of the flange portion.
Figure 6A:
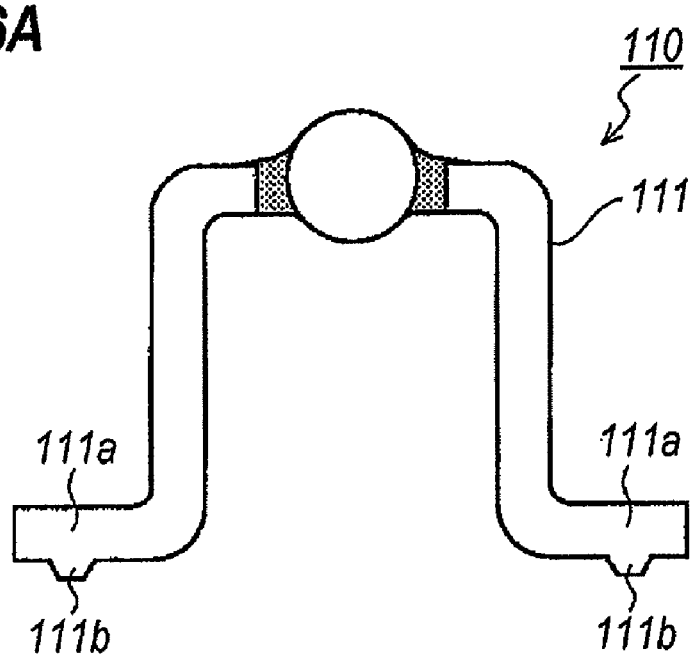
FIG. 6A is a cross section of a conventional cap with a flange portion only providing a ringed projection, and FIG. 6B schematically illustrates a failure that fragments due to the welding of the projection to the stem are flown within the space of the cap.
Figure 6B:
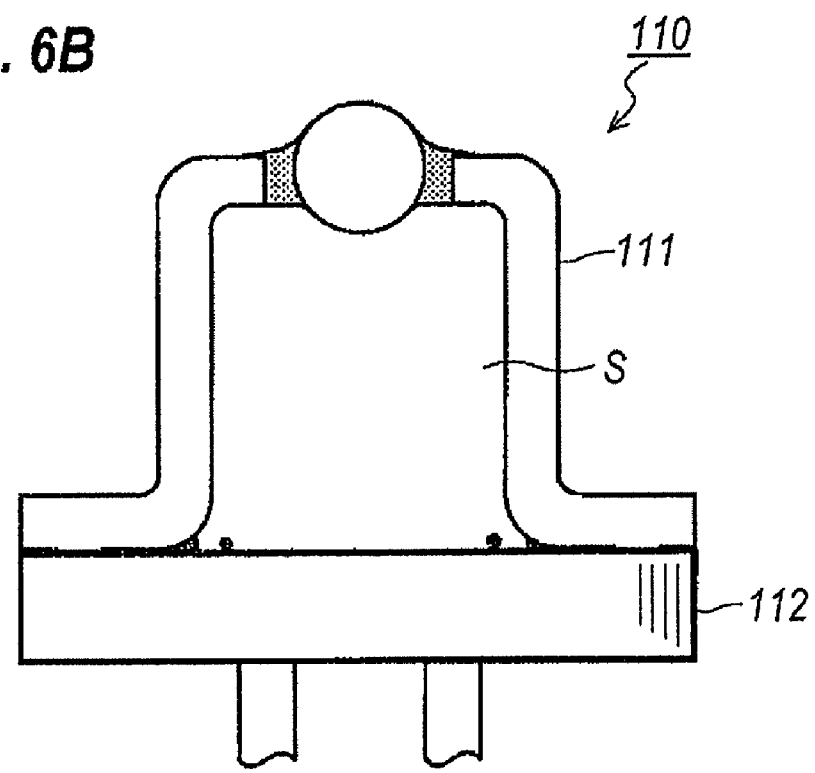
Figure 7:
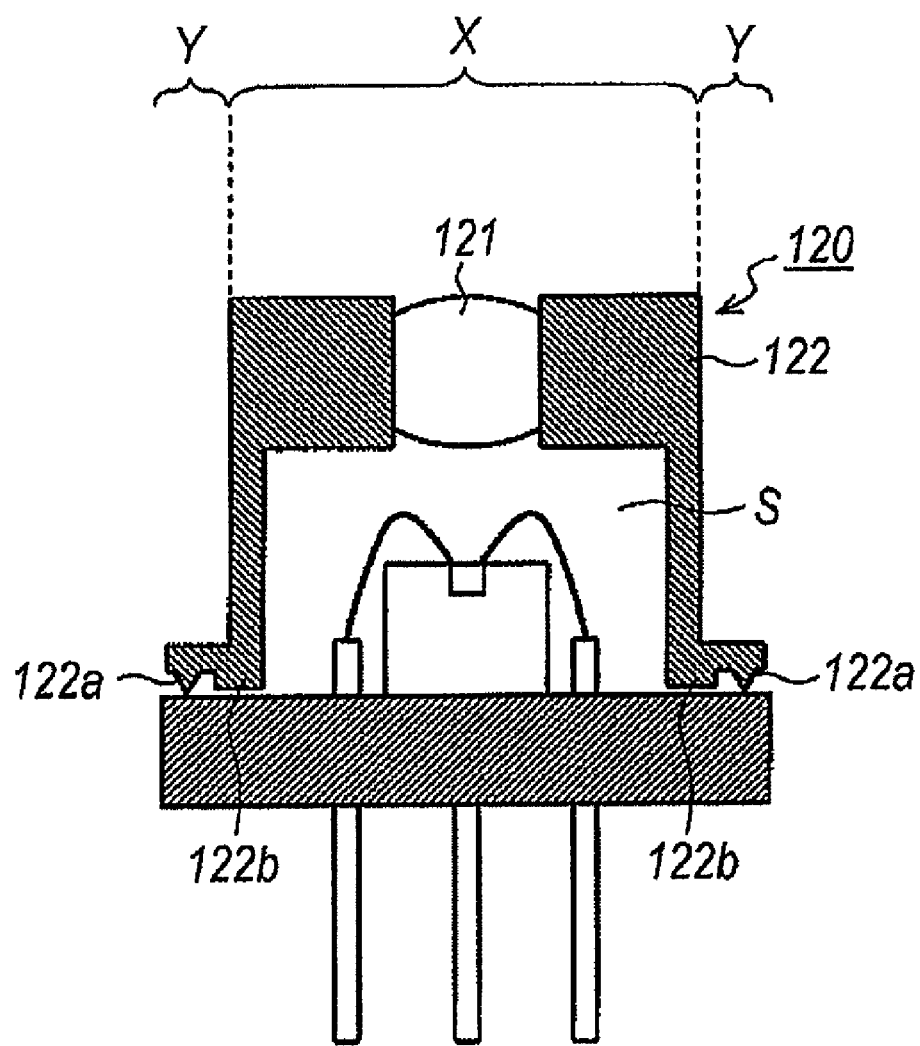
FIG. 7 schematically illustrates another type of the cap with the ringed projection accompanied with a step to define the welded height of the projection.

FIG. 5 illustrates another cap 4A that provides a modified flange portion FA. Structures similar to those already illustrated in FIGS. 2A to 2C are referred by the same symbols or the same numerals, and the overlapped explanations will be omitted. The shell 4Ab of the present example comprises the body portion B and the flange portion FA around the body portion B. On the top surface F3 of the flange portion FA is formed in flat different from that of the flange portion F illustrate in FIG. 2. The flat surface F3 of the flange portion FA may facilitate to press the flange portion FA against the stem 3 at the projection welding. The bottom surface of the flange portion FA, which is the opposite surface to the flat surface F3, provides the ringed projection F1 for the projection welding and the ringed groove immediate inside of the ringed projection. These ringed projection F1 and the ringed groove are formed in concentric circle. Thus, the ringed groove F2 may effectively capture the fragments caused by the projection welding of the ringed projection.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

I claim:

1. An optical device that provides a semiconductor optical device, comprising:
    a metal stem with a disk shape and configured to mount said semiconductor optical device thereon; and
    a cap including a body portion with a substantially cylindrical shape and a flange portion provided in an end of said body portion, said flange portion providing a ringed projection welded to said metal stem and a ringed groove formed immediately inside of said ringed projection, said ringed groove having a hollow extending to a direction opposite to said ringed projection,
    wherein said body portion and said flange portion are formed by stamping of a metal sheet including said ringed projection and said ringed groove, and
    wherein said ringed groove captures fragments caused by said welding of said ringed projection to said stem.

2. The optical device according to claim 1,
    wherein said hollow of said ringed groove has a cross section of a trapezoid with a volume substantially equal to or greater than a volume of said ringed projection before said welding.

3. The optical device according to claim 1,
    wherein said cap is made of alloy of iron (Fe), nickel (Ni) and cobalt (Co).

4. The optical device according to claim 1,
    wherein said cap is made of cold-rolled steel.

5. A metal cap to be welded to a metal stem to form an optical device, said metal cap and said metal stem forming a CAN package, comprising:
    a body portion having a substantially cylindrical shape; and
    a flange portion provided in one end of said body portion and having a ringed projection extending to a direction opposite to said body portion and a ringed groove formed immediately inside of said ringed projection, said ringed projection having a concentric circle with said ringed groove,
    wherein said body portion and said flange portion are simultaneously formed by stamping of metal sheet.

6. The metal cap according to claim 5,
    wherein said ringed projection has a cross section of an isosceles triangle.

7. The metal cap according to claim 6,
    wherein said isosceles triangle has an apex angle of about 75° and a truncated apex portion.

8. The metal cap according to claim 6,
    wherein said ringed projection has a height of 0.1 mm.

9. The metal cap according to claim 5,
    wherein said ringed projection provides a cross section of a trapezoid.

10. The metal cap according to claim 5,
    wherein said ringed groove has a cross section of a trapezoid.

11. The metal cap according to claim 10,
    wherein said ringed projection has a cross section of a trapezoid with a volume equal to or less than a volume of said trapezoid of said ringed groove.

12. The metal cap according to claim 5,
    wherein said ringed groove is an concentric circle with said ringed projection.

13. The metal cap according to claim 5,
    wherein said metal sheet is made of alloy of iron (Fe), nickel (Ni) and cobalt (Co).

14. The metal cap according to claim 5,
    wherein said metal sheet is made of cold-rolled steel.

* * * * *